United States Patent
Ouchi

(10) Patent No.: US 7,253,907 B2
(45) Date of Patent: Aug. 7, 2007

(54) MEASURING METHOD AND APPARATUS USING SHEARING INTERFEROMETRY, EXPOSURE METHOD AND APPARATUS USING THE SAME, AND DEVICE MANUFACTURING METHOD

(75) Inventor: Chidane Ouchi, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 382 days.

(21) Appl. No.: 10/994,331

(22) Filed: Nov. 23, 2004

(65) Prior Publication Data

US 2005/0117168 A1    Jun. 2, 2005

(30) Foreign Application Priority Data

Nov. 27, 2003    (JP)    ............... 2003-396790

(51) Int. Cl.
*G01B 9/02*    (2006.01)
(52) U.S. Cl. .................. 356/520; 356/515; 356/521
(58) Field of Classification Search ................ 356/515, 356/520, 521, 550
See application file for complete search history.

(56) References Cited

U.S. PATENT DOCUMENTS

| | | | |
|---|---|---|---|
| 5,067,811 A | 11/1991 | Ouchi | ............... 356/121 |
| 6,322,220 B1 | 11/2001 | Sano et al. | ............... 359/615 |
| 6,661,522 B2 | 12/2003 | Ouchi | ............... 356/515 |
| 6,774,982 B2 | 8/2004 | Ouchi | ............... 355/67 |
| 6,853,442 B2 | 2/2005 | Ouchi | ............... 355/69 |
| 2004/0085548 A1 | 5/2004 | Ouchi | ............... 356/515 |

FOREIGN PATENT DOCUMENTS

JP    2000-146705    5/2000

*Primary Examiner*—Gregory J. Toatley, Jr.
*Assistant Examiner*—Scott M. Richey
(74) *Attorney, Agent, or Firm*—Fitzpatrick, Cella, Harper & Scinto

(57) ABSTRACT

A measuring method for measuring a wave front of light, which has passed through a target optical system. The method includes the steps of dividing the light that passes the target optical system into a first wave front and a second wave front made by offsetting the first wave front by a predetermined amount in a predetermined direction, obtaining information concerning an interference fringe using shearing interference with divided light, calculating a differential wave front between the first wave front and the second wave front by using the information concerning the interference fringe obtained in the obtaining step, and correcting the differential wave front based on the predetermined amount and a wave number in the predetermined direction.

12 Claims, 7 Drawing Sheets

⇩

US 7,253,907 B2

MEASURING METHOD AND APPARATUS USING SHEARING INTERFEROMETRY, EXPOSURE METHOD AND APPARATUS USING THE SAME, AND DEVICE MANUFACTURING METHOD

This application claims foreign priority based on Japanese Patent Application No. 2003-396790, filed Nov. 27, 2003, which is hereby incorporated by reference herein.

BACKGROUND OF THE INVENTION

The present invention relates generally to a measuring method and apparatus, and, more particularly, to a measuring method and apparatus that use shearing interferometry to measure a wave front aberration of a target optical system, such as a projection optical system, which transfers a mask pattern onto an object, and an exposure method and apparatus using the measuring method and apparatus. The inventive measuring method and apparatus is suitable, for example, for measurement of a projection optical system in an exposure apparatus that utilizes extreme ultraviolet ("EUV") light.

A projection exposure apparatus is used to transfer a pattern on a mask (or a reticle) onto an object to be exposed in manufacturing semiconductor devices, etc., in a photolithography process. This exposure apparatus is required to transfer the pattern on the reticle onto the object precisely at a predetermined magnification. For this purpose, it is important to use a projection optical system having a good imaging performance and reduced aberration. In particular, due to the recent demands for finer processing of semiconductor devices, a transferred pattern is sensitive to the aberration of the optical system. Therefore, there is a demand to measure the wave front aberration of the projection optical system with high precision.

The shearing interferometry is conventionally known as a method for measuring a wave front aberration of a projection optical system (see, for example, Japanese Patent Application, Publication No. 2000-146705). Since the shearing interferometry provides relatively easy alignments and has a wide measurable range of aberration, the improvement of the measurement precision is strongly demanded. The shearing interferometry typically measures differential wave fronts in two orthogonal directions, integrates the entire measured area surface in the shearing directions from a reference point, such as a center point, using these two differential wave fronts, and obtains a shape of the entire target wave front.

One method for measuring the target wave front in the shearing interferometer is to approximately calculate the target wave front by integrating the differential wave front of a component having a period sufficiently larger than the shearing amount, i.e., an offset amount of the wave front, among the spatial wave number components in the target wave front or a low-frequency component of the target wave front. In other words, when the shearing amount is sufficiently smaller than the frequency component of the target wave front, the differential wave front can be considered to be substantially equivalent to the differentiated wave front obtained by differentiating the target wave front. The target wave front can be calculated by integrating the differential wave front measured by the shearing interferometer. However, the recent demand for the improved precision of the projection optical system requires a precise shape of the equivalent wave front including the wave front information of the spatially high-frequency component. The shearing interferometer directly measures only the differential wave front of the target wave front, which is, strictly speaking, not the differentiated wave front. Therefore, a mere integration of the differential wave front causes increased errors in wave number components having periods close to the shearing amount. This is because, as the frequency component of the target wave front becomes higher, the shearing amount cannot be considered to be sufficiently smaller than the frequency component, and thus, the differential wave front cannot be considered to be equivalent to the differentiated wave front. For example, a measured value of a wave number component having a period twice as many as a shearing amount is $(2/\pi) \times 100 = 64\%$ of an actually measured value. This problem is solved when measurements cover high-frequency wave number components by reducing a shearing amount. However, in turn, the noise influence becomes problematic due to the reduced output of the differential wave front measured by the interferometer.

BRIEF SUMMARY OF THE INVENTION

Accordingly, it is an illustrative object of the present invention to provide a measuring method and apparatus for measuring a wave front of a target optical system in a wide frequency-component range that covers a higher frequency component than the conventional ones using the shearing interferometry, an exposure method and apparatus using them, and a device manufacturing method.

A measuring method according to one aspect of the present invention for measuring a wave front of light, which has passed through a target optical system, includes the steps of generating an interference fringe using shearing interference with light that passes a target optical system, calculating a differential wave front between a first wave front of the light that passes the target optical system and a second wave front made by offsetting the first wave front by a predetermined amount in a predetermined direction, and correcting the differential wave front based on the predetermined amount and the wave number in the predetermined direction.

The calculating step may include the step of calculating a two-dimensional wave number distribution function through a two-dimensional Fourier transformation to the differential wavefront, wherein the correcting step includes the step of multiplying the two-dimensional wave number distribution function by a correction coefficient of $1/(2i \times \sin(\alpha \Delta x/2))$, where $\Delta x$ is the predetermined amount, $\alpha$ is the wave number in the predetermined direction, and $i$ is the imaginary unit, and wherein the measuring method calculates the wave front of the target optical system through a two-dimensional inverse Fourier transformation to the wave number distribution function multiplied by the correction coefficient. The measuring method may further include the step of varying at least one of the predetermined amount and the predetermined direction.

An exposure method according to another aspect of the present invention includes the steps of calculating a wave front aberration of a target optical system using the above measuring method, adjusting the target optical system based on the wave front aberration of the target optical system, which is calculated by the calculating step, and exposing an object using the target optical system adjusted by the adjusting step.

A measuring apparatus according still another aspect of the present invention for measuring wave front of light, which has passed through a target optical system, includes an interference part for generating an interference fringe using shearing interference with light that passes the target optical system, an offset part for offsetting a wave front of the light that passes the target optical system by a predetermined amount in a predetermined direction, an operation part for correcting a differential wave front between a first wave front of the light that passes the target optical system and a second wave front made based on the predetermined amount and the wave number in the predetermined direction, and for calculating the first wave front of the target optical system based on the differential wave front.

A measuring apparatus may further include plural exchangeable diffraction gratings each for dividing the light, the plural diffraction gratings having different grating constants. The measurement apparatus may further include plural exchangeable diffracting gratings each for dividing the light, the plural diffracting gratings having different pattern directions. The measuring apparatus may further include a light divider for dividing the light, the light divider being rotatable around an optical axis of the target optical system. The measuring apparatus may further include a unit that changes at least one of the predetermined amount and the predetermined direction.

An exposure apparatus according to another aspect of the present invention, for exposing a pattern on a mask onto an object using light, includes a projection optical system for projecting the pattern onto the object, and the above measuring apparatus for detecting a wave front aberration of the projection optical system. The light may have a wavelength of 20 nm or smaller.

A device manufacturing method according to another aspect of the present invention includes the steps of exposing an object to be exposed using the above exposure apparatus, and developing the object exposed. Claims for a device fabricating method for performing operations similar to that of the above exposure apparatus cover devices as intermediate and final products. Such devices include semiconductor chips, such as LSIs and VLSIs, CCDs, LCDs, magnetic sensors, thin film magnetic heads, and the like.

Other objects and further features of the present invention will become readily apparent from the following description of the preferred embodiments with reference to the accompanying drawings.

DETAILED DESCRIPTION OF THE PREFERRED EMBODIMENTS

Figure 1:
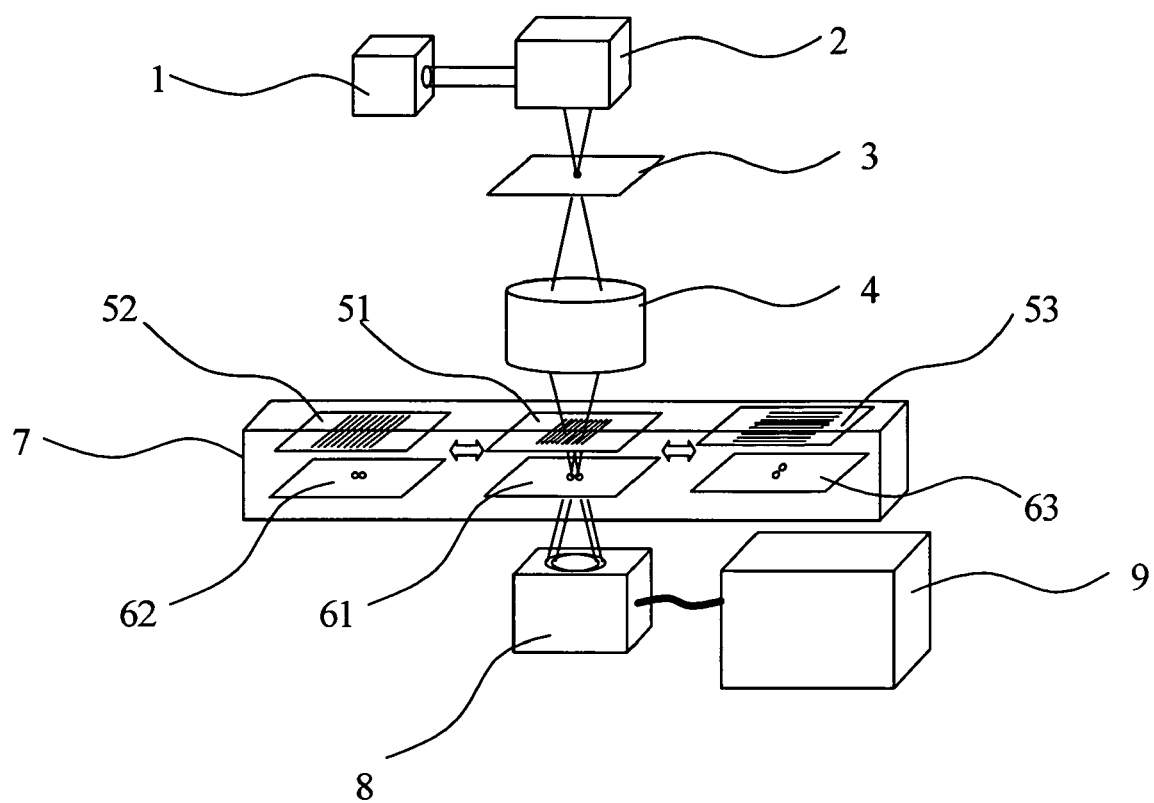
FIG. 1 is an optical path diagram of a measuring apparatus according to one embodiment of the present invention.

The inventor of the subject application has discovered that a high-frequency component is correctly calculated by calculating a wave number distribution function through a Fourier transformation to a differential wave front, multiplying the wave number distribution function by a corrected coefficient, and executing an inverse Fourier transformation to the result, instead of merely integrating the differential wave front. A description will now be given of the wave front calculating method in the measuring method of the instant embodiment.

First, a correction coefficient is calculated based on a result of a relationship between a wave number distribution function of a target wave front and a wave number distribution function of a differential wave front. The target wave front is $W(x, y)$, and its Fourier transformation $F(\alpha, \beta)$ is a spatial wave number distribution function of $W(x, y)$, where $\alpha$ and $\beta$ are wave numbers in x and y directions. $W(x, y)$ is an inverse Fourier transformation in view of $F(\alpha, \beta)$ and, thus, the following equation is established:

$$W(x, y) = \frac{1}{2\pi} \int \int F(\alpha, \beta) \exp(i(\alpha x + \beta y)) d\alpha d\beta. \tag{1}$$

Wave fronts $W(x+\Delta x/2)$ and $W(x-\Delta x/2)$, which are sheared from the original wave front $W(x, y)$ by $\pm\Delta x/2$ in the x direction are expressed as follows, where $\Delta x$ is the shearing amount by the shearing interferometer, $\alpha$ is the wave number in the x direction, and $\beta$ is the wave number in the y direction:

$$W(x+\Delta x/2, y) = \frac{1}{2\pi} \int \int F(\alpha, \beta) \exp\left(i\left(\alpha x + \frac{\alpha \Delta x}{2} + \beta y\right)\right) d\alpha d\beta \tag{2}$$

$$W(x-\Delta x/2, y) = \frac{1}{2\pi} \int \int F(\alpha, \beta) \exp\left(i\left(\alpha x - \frac{\alpha \Delta x}{2} + \beta y\right)\right) d\alpha d\beta. \tag{3}$$

Therefore, the wave front measured in the shearing interferometer of the differential wave front $Wx(x, y)$ is expressed as follows:

$$Wx(x, y) = W(x+\Delta x/2, y) - W(x-\Delta x/2, y) \tag{4}$$

$$= \frac{1}{2\pi} \int \int F(\alpha, \beta) \exp(i(\alpha x + \beta y)) \left(\exp\left(i\frac{\alpha \Delta x}{2}\right) - \exp\left(-i\frac{\alpha \Delta x}{2}\right)\right) d\alpha d\beta$$

$$= \frac{1}{2\pi} \int \int F(\alpha, \beta) 2i \sin\frac{\alpha \Delta x}{2} \exp(i(\alpha x + \beta y)) d\alpha d\beta.$$

The left side $F(\alpha,\beta)2i\sin\alpha\Delta x/2$ is a definition of the inverse Fourier transformation, and, thus, the following equation is obtained through the Fourier transformation to Equation 4:

$$Fx(\alpha, \beta) = F(\alpha, \beta) 2i \sin\frac{\alpha \Delta x}{2}. \tag{5}$$

Here, $Fx(\alpha, \beta)$ is the Fourier transformation of $Wx(x, y)$ and the wave number distribution function of $Wx(x, y)$:

$$Fx(\alpha,\beta) = \int \int Wx(x,y) \exp(i(\alpha x + \beta y)) dx dy. \tag{6}$$

$Fx(\alpha, \beta)$ is calculated by substituting the actually measured differential wave for $Wx(x, y)$ in Equation 6. The following equation is established from Equation 5:

$$F(\alpha, \beta) = \frac{Fx(\alpha, \beta)}{2i\sin\frac{\alpha\Delta x}{2}}. \quad (7)$$

The target wave front W(x, y) is calculated by the following equation from Equations 1 and 7:

$$W(x, y) = \frac{1}{2\pi}\int\int \frac{Fx(\alpha, \beta)}{2i\sin\frac{\alpha\Delta x}{2}}\exp(i(\alpha x + \beta y))d\alpha d\beta. \quad (8)$$

Thus, precise measurements are available from low to high frequencies except for the wave number component that satisfies $$\sin\frac{\alpha\Delta x}{2} = 0,$$

or $\alpha = 2n\pi/\Delta x$ (n is an integer).

A description will now be given of a method of calculating immeasurable wave number components that satisfy $$\sin\frac{\alpha\Delta x}{2} = 0,$$

which are referred to as dead components hereinafter. This method includes a method that varies a shearing amount, and a method that varies a shearing direction.

For measurements using variable shearing amounts, the dead component becomes $\alpha_1 = 2n\pi/\Delta x_1$ as a result of measurement with a shearing amount $\Delta x_1 (\neq \Delta x)$. Therefore, the measurements using the shearing amounts $\Delta x$ and $\Delta x_1$ enable one dead component to be complemented by the other measurement. Even in this case, a component having $\alpha = 0$ and components having common multiples between $2\pi/\Delta x$ and $2\pi/\Delta x_1$ still remain as dead components. However, when $\Delta x$ and $\Delta x_1$ are set so that the minimum common multiple between $2\pi/\Delta x$ and $2\pi/\Delta x_1$ is made larger than the addressed wave number region, any components except for one having $\alpha$ of 0 or a component that is constant in the x direction can be measured.

For measurements using variable shearing directions, the shearing directions are varied in the x and y directions for measurements. The target wave front is expressed as follows, where $\Delta y$ in the shearing amount in the y direction:

$$W(x, y) = \frac{1}{2\pi}\int\int \frac{Fs(\alpha, \beta)}{2i\sin\frac{\beta\Delta y}{2}}\exp(i(\alpha x + \beta y))d\alpha d\beta. \quad (9)$$

In this case, the dead components are wave numbers that satisfy $$\sin\frac{\beta\Delta y}{2} = 0$$

or $\beta = 2n\pi/\Delta y$ (n is an integer). Therefore, only the wave number components remain as the dead components that simultaneously meet the following equations by mutually complementing the dead components through the shearing measurements in both the x and y directions, and almost all the wave number components can be measured:

$$\alpha = 2n\pi/\Delta x \quad (10)$$

$$\beta = 2m\pi/\Delta y. \quad (11)$$

While the instant embodiment sets the shearing directions to the x and y directions, the two directions do not have to be orthogonal and may be inclined, for example, by 45° and 60°.

The dead component can be completely eliminated by at least three combinations of measurements using different shearing amounts and/or the shearing directions. In one embodiment, the measurements use shearing directions of one parallel to the x axis, one inclined to the x axis by 30° and one inclined to the x axis by 90° or the y axis. Since there is no common dead component, all the wave number components can be measured (except for a so-called piston component having $\alpha = 0$ and $\beta = 0$). Another embodiment can also substantially eliminate the dead component by using a combination of x shearing measurements that use the shearing amount of 1/10 and 1/11 of numerical aperture ("NA") and a y shearing amount. Although vibrating common dead components exist at periods of NA times $(1/10) \times (1/11) = 1/110$ and its multiple with (1/integer), these high-frequency components are unnecessary to be measured in general. Even if necessary, another measurement using a different shearing amount can solve this problem. Of course, there are other myriads of combinations for complementing the dead components.

FIG. 1 shows a structure of a measuring apparatus according to one embodiment of the present invention. In FIG. 1, reference numeral 1 denotes a light source, reference numeral 2 denotes a condenser system, reference numeral 3 denotes a pinhole mask, reference numeral 4 denotes a target optical system, reference numerals 51, 52 and 53 denote diffraction gratings, reference numerals 61, 62 and 63 denote order selection windows that allow only ±first order diffracted lights to pass, reference numeral 7 denotes a switch of the diffraction grating and order selection window, reference numeral 8 denotes an image pickup device, such as a CCD camera, and reference numeral 9 denotes a wave front processor. The diffracting gratings 51 and 52 have different grating coefficients, although their pattern line directions are parallel to each other. The diffraction gratings 51 and 53 have orthogonal pattern line directions. The switch may serve as drive means for rotating the diffraction grating.

In the wave front aberration measurement, the wave front of the light emitted from the light source 1 becomes a spherical wave after the condenser system 2 allows the light to pass a fine pinhole in the pinhole mask 3 arranged at the object position of the target optical system. The light that passes the target optical system has the spherical wave front equal to the equivalent wave front aberration of the target optical system. Next, the diffraction grating 51 divides the light into plural diffracted light, and only the ±first order diffracted lights pass the order selection window 61. FIG. 1 does not show other diffracted lights except for ±first order lights for illustrative convenience. While the ±first order diffracted lights have the same wave front as the light that passes the target optical system 4, their principal rays have different directions due to diffractions and they overlap on the image pickup device 8 while laterally offsetting from each other, causing so-called shearing interference fringes. The generated interference fringe image is fed to the wave front processor 9, which, in turn, calculates the equivalent wave front of the target optical system 4 based on the fed interference fringe image.

Figure 2:
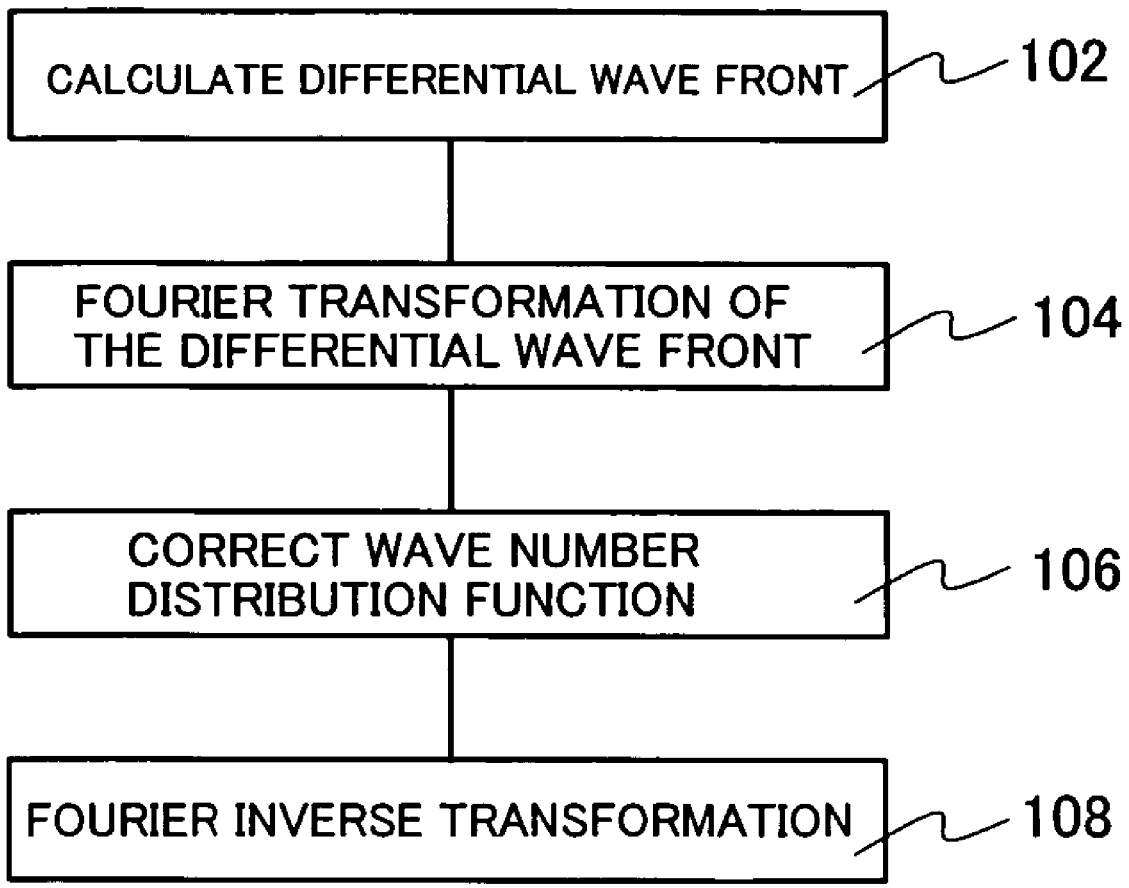
FIG. 2 is a flowchart for explaining an operation method in the measuring method according to one embodiment of the present invention.

Referring now to FIGS. 2 and 3A-3E, a description will be given of the operation procedure in the wave front processor 9. Here, FIG. 2 is a flowchart for explaining the operation method by the wave front processor 9. FIGS. 3A-3E are waveform diagrams showing wave fronts obtained at each processing stage. This embodiment sets the first shearing direction to the x direction and the shearing amount to $\Delta x$.

Figure 3A:
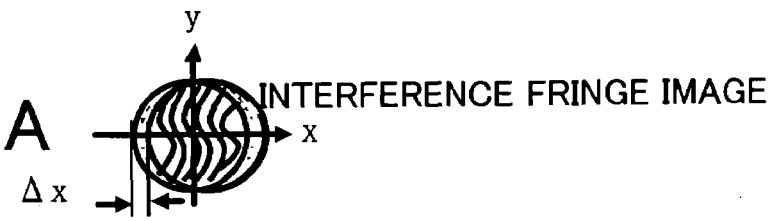
FIGS. 3A-3E are waveform diagrams showing a wave front obtained in each processing stage shown in FIG. 2.
Figure 3B:

First, the differential W(x, y) of the target wave front shown in FIG. 3B is calculated from the interference fringes shown in FIG. 3A (step 102). While a method for calculating the differential wave front is not described in detail here, a phase difference between the ±first order lights is stepwise varied, as known as a phase shift method, for example, by moving the diffraction grating 51 by every equal distance of 1/(small integer of the granting interval), and the differential wave front is calculated by analyzing plural interference fringe images.

Figure 3C:
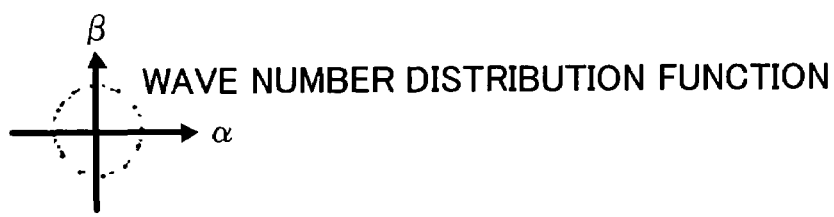

Next, the wave number distribution function $Fx(\alpha, \beta)$ shown in FIG. 3C is calculated through the Fourier transformation to a differential wave front shown in FIG. 3B (step 104), where $\alpha$ and $\beta$ are wave numbers in the x and y directions, respectively.

Figure 3D:
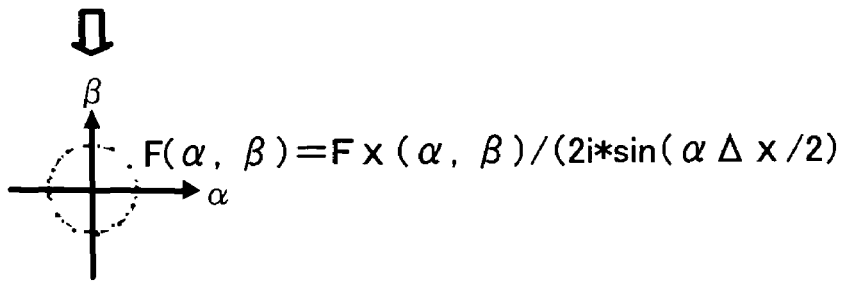

Next, $F(\alpha, \beta)$ is calculated as shown in FIG. 3D by multiplying the distribution function $Fx(\alpha, \beta)$ shown in FIG. 3C by a correction coefficient $1/\{2i \times \sin(\alpha \Delta x/2)\}$ (step 106), where i is the imaginary unit.

Figure 3E:

Next, the target wave front W(x, y) is calculated as shown in FIG. 3E through the inverse Fourier transformation to the wave number distribution function $Fx(\alpha, \beta)$ shown in FIG. 3D (step 108).

A description will now be given of treatments of the dead components. As discussed, $Fx(\alpha, \beta)$ is always zero for $\alpha = 2n\pi/\Delta x$ and these components cannot be calculated. In order to avoid this problem, measurements are resumed by varying the shearing amount and direction. In order to vary the shearing amount, diffraction gratings having different grating coefficients are used. In order to vary the shearing direction, diffraction gratings having different orientations are used or the same diffraction grating is rotated around the optical axis. Of course, the order selection window should be exchanged or rotated in accordance with the shearing amount and the shearing direction. In the instant embodiment, the switch 7 for the diffraction grating and the order selection window shown in FIG. 1 can simultaneously switch them.

Figure 4:
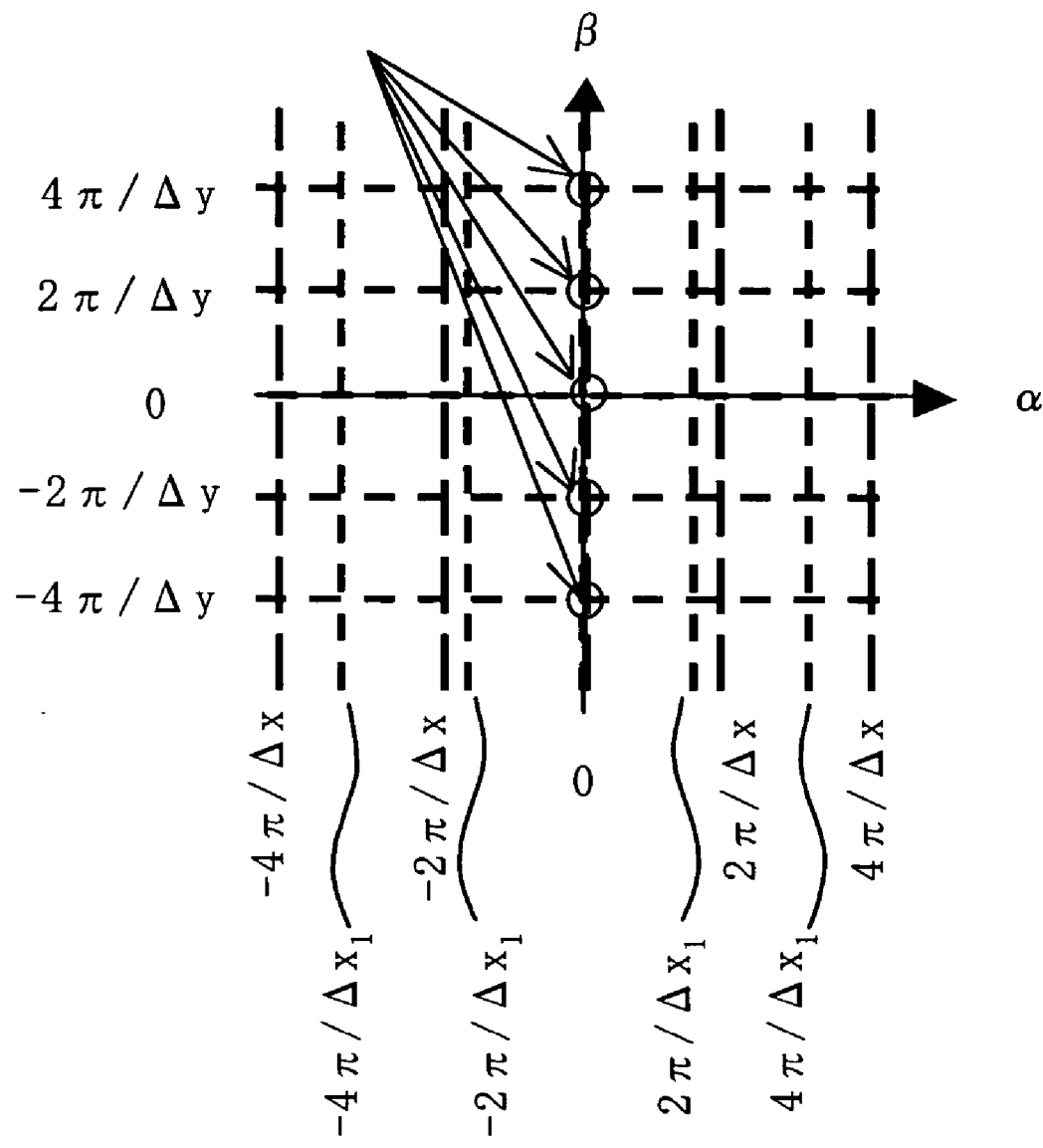
FIG. 4 is a view showing a dead component in the wave number space in the measuring method according to one embodiment of the present invention.

FIG. 4 shows a dead component in the wave number space. The longitudinal broken line expresses the dead component measured with two different shearing amounts $\Delta x$ and $\Delta x_1$, while the shearing direction is maintained in the x direction. The respective dead components are wave number components having an $\alpha$ of $2n\pi/\Delta x$ and $2n_1\pi/\Delta x_1$ (n and $n_1$ are integers), and the dead components can be mutually complemented by selecting the shearing amounts $\Delta x$ and $\Delta x_1$ properly, although the common dead component having $\alpha$ zero or a component that is constant in the x direction cannot be complemented. Next, the switch 7 for the diffraction grating and order selection window switches them so that the shearing direction becomes the y direction. The dead component is a wave number component having a $\beta$ of $2m\pi/\Delta y$, where $\Delta y$ is the shearing amount, and m is an integer. The lateral broken line in FIG. 4 indicates the dead component in this case, and it is understood that only the slight residue remains in the dead components, which cannot be complemented by these three measurements. It is easily understood that all the dead components other than $(\alpha, \beta) = (0, 0)$ can be complemented if there is a measurement with a different shearing amount in they direction, or a measurement having a different shearing direction from the x and y directions, such as a direction of 45°. The target wave front can be precisely produced through the inverse Fourier transformation to the obtained wave number distribution function. Since the component having $(\alpha, \beta) = (0, 0)$ is a plane component that is usually called a piston and is not the wave front aberration, no problem occurs even if it is not measured.

As discussed, the shearing interferometer of the instant embodiment can measure the wave front aberration of the target optical system precisely including spatially high-frequency components.

Figure 5:
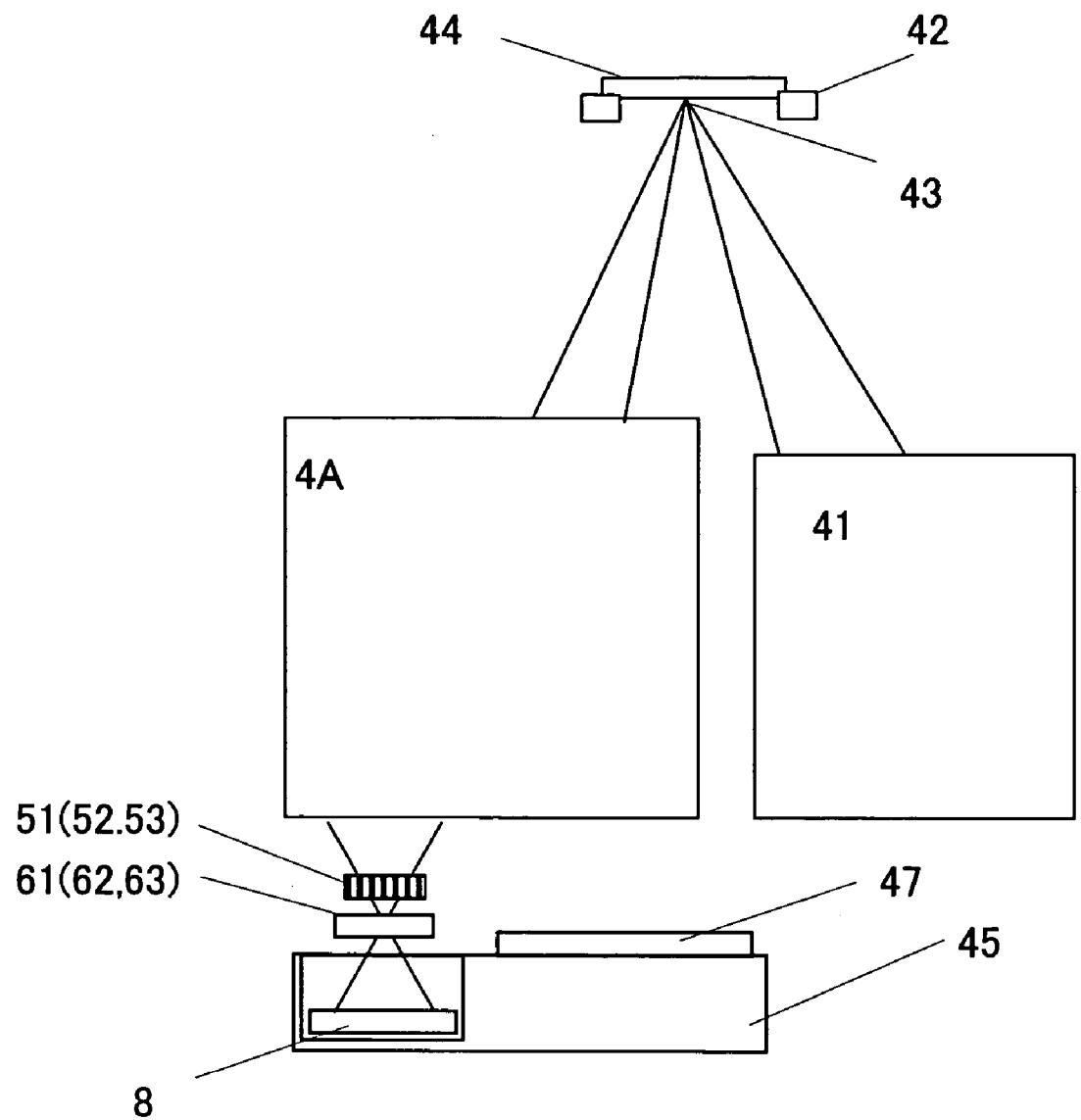
FIG. 5 is an optical path diagram for explaining an exposure apparatus according to one embodiment of the present invention.

Referring now to FIG. 5, a description will be given of an exposure apparatus 40 according to another embodiment of the present invention. Here, FIG. 5 is a schematic block diagram of the exposure apparatus 40 that utilizes the EUV light as the exposure light, although the inventive exposure apparatus is not limited to the EUV light.

In FIG. 5, reference numeral 41 denotes an illumination optical system including the light source, reference numeral 42 denotes a reticle stage, and reference numeral 44 denotes a reticle. In measuring the wave front aberration, the reticle 44 has a reflection pinhole 43 or a fine reflection area as large as a pinhole in the pinhole mask 3 in FIG. 1. In exposing a wafer, a circuit pattern of a semiconductor device, (e.g., a semiconductor chip, such as an IC and an LSI, a liquid crystal panel, and a CCD) is formed on the reticle 44. Reference numeral 4A denotes a projection optical system as a target optical system. Reference numeral 45 denotes a wafer stage. Reference numerals 51 to 53 denote diffraction gratings, and reference numerals 61 to 63 are order selection windows. The diffraction gratings and order selection windows are aligned in the lateral direction to the paper surface in FIG. 1 and in a perpendicular direction with the paper surface in FIG. 5. FIG. 5 omits the switch (or drive means) 7 and processor 9 for convenience. The diffraction gratings 51 to 53 and order selection windows 61 to 63 are configured to be switched by drive means (not shown). Reference numeral 8 denotes the image pickup device, and reference numeral 47 denotes an object to be exposed, which is a wafer in the instant embodiment. The diffraction gratings 51 to 53, the order selection windows 61 to 63, and the image pickup device 8, are integrated with each other and arranged on the wafer stage 45.

In order to measure the wave front aberration of the projection optical system 4A with such a configuration, the illumination optical system 41 illuminates the reticle 44, and the diffraction grating 51, or the like, divides the wave front that is emitted from the reflection pinhole 43 and is spherical in one direction. The projection optical system 4A shields the zeroth order light, and allows the first order diffracted lights top enter the order selection windows 61 to 63, and the image pickup device 8 obtains interference fringes. The interference fringes correspond to a differentiation of the original wave front, and the processor 9 obtains the original wave front information by providing the Fourier transformation to the differential wave front information, then correcting the same, and providing the inverse Fourier transformation to the result. The aberrational characteristics of the projection optical system 4A in the view angle are measured by switching the diffraction grating 51 using the switch 7, and similarly measuring the aberration at arbitrary several points in the view angle of the projection optical system 4A. This embodiment can easily add an aberration measuring function to the projection exposure apparatus by using a reflection mask pattern.

A description will now be given of an aberration correction method according to one embodiment of the present invention. The exposure apparatus 10 allows plural optical elements (not shown) in the projection optical system to move in the optical-axis direction and/or a direction orthogonal to the optical-axis direction. By driving one or more optical elements using the driving system (not shown) for aberration adjustments based on aberrational information obtained from the instant embodiment, it is possible to correct or to optimize one or more aberrations of the projection optical system, in particular, Seidel's classification of aberrations. The means for adjusting the aberration of the projection optical system various known systems can be used, such as a movable lens, a movable mirror (when the projection optical system is a catadioptric optical system or a full-mirror optical system), an inclinable parallel plate, a pressure-controllable space, and a surface correction type using an actuator.

Figure 6:
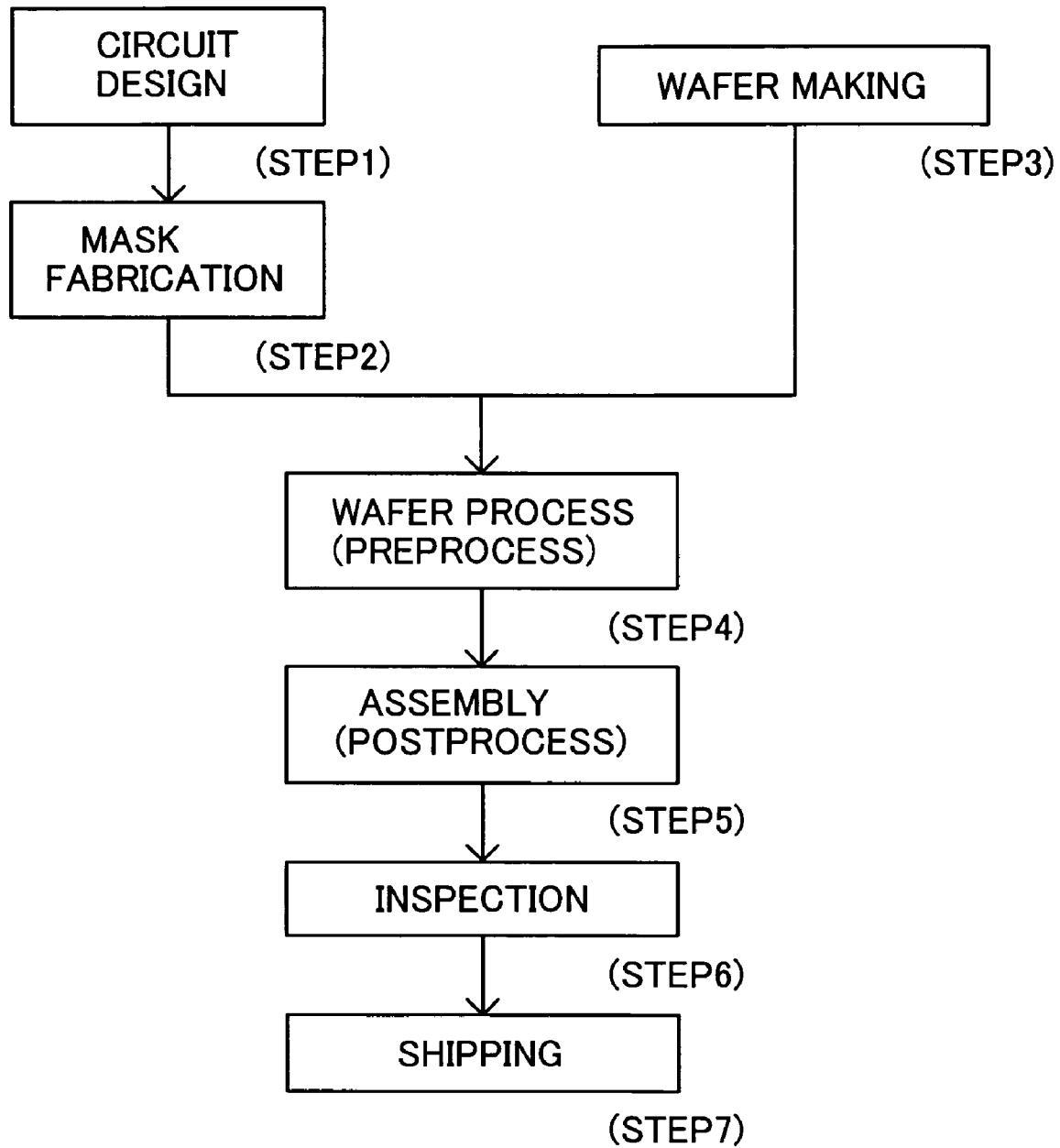
FIG. 6 is a flowchart for explaining a method for fabricating devices (e.g., semiconductor chips, such as ICs, LSIs, and the like, as well as LCDs, CCDs, etc.).

A description will now be given of an embodiment of a device manufacturing method using the exposure apparatus 40. FIG. 6 is a flowchart for explaining fabrication of a device (i.e., semiconductor chips such as ICs and LSIs, LCDs, CCDs, etc.). Here, a description will be given of a fabrication of a semiconductor chip as an example. Step 1 (circuit design) designs a semiconductor device circuit. Step 2 (mask fabrication) forms a mask having a designed circuit pattern. Step 3 (wafer making) manufactures a wafer using materials such as silicon. Step 4 (wafer process), which is referred to as a pretreatment, forms actual circuitry on the wafer through photolithography using the mask and wafer. Step 5 (assembly), which is also referred to as a post-treatment, forms into a semiconductor chip the wafer formed in Step 5 and includes an assembly step (e.g., dicing, bonding), a packaging step (chip sealing), and the like. Step 6 (inspection) performs various tests for the semiconductor device made in Step 5, such as a validity test and a durability test. Through these steps, a semiconductor device is finished and shipped (Step 7).

Figure 7:
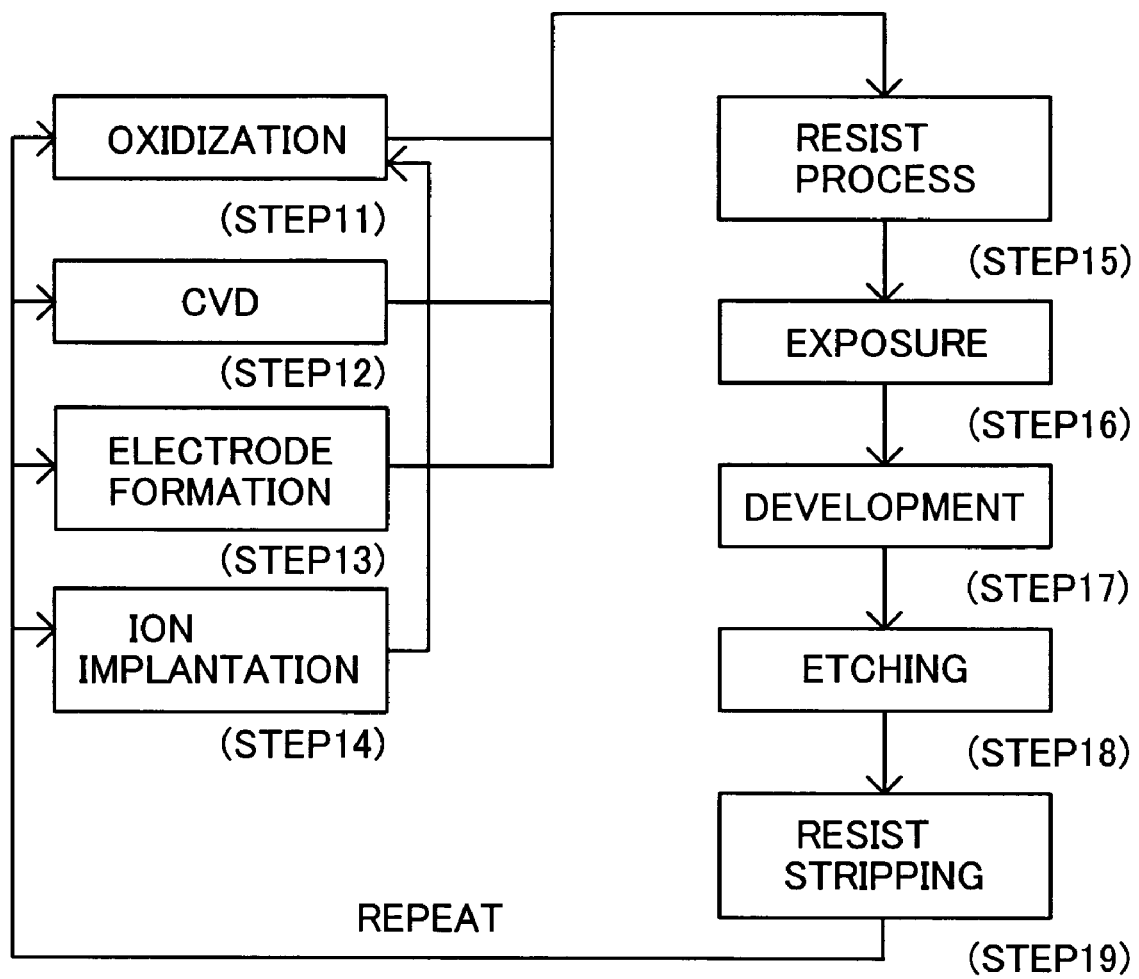
FIG. 7 is a detailed flowchart for Step 4 of the wafer process shown in FIG. 6.

FIG. 7 is a detailed flowchart of the wafer process in Step 4 shown in FIG. 6. Step 11 (oxidation) oxidizes the wafer's surface. Step 12 (CVD) forms an insulating film on the wafer's surface. Step 13 (electrode formation) forms electrodes on the wafer by vapor deposition, and the like. Step 14 (ion implantation) implants ions into the wafer. Step 15 (resist process) applies a photosensitive material onto the wafer. Step 16 (exposure) uses the exposure apparatus 40 to expose a circuit pattern on the mask onto the wafer. Step 17 (development) develops the exposed wafer. Step 18 (etching) etches parts other than a developed resist image. Step 19 (resist stripping) removes unused resist after etching. These steps are repeated, and multilayer circuit patterns are formed on the wafer. The manufacturing method of the present invention can manufacture semiconductor devices, which have been difficult to manufacture, because the wave front aberration has been corrected with high precision.

The present invention thus can provide a measuring method and apparatus for measuring a wave front of a target optical system in a wide frequency-component range that covers a higher frequency component than conventional ones using shearing interferometry, an exposure method and apparatus using the present invention, and a device manufacturing method.

What is claimed is:

1. A measuring method for measuring a wave front of light, which has passed through a target optical system, said method comprising the steps of:
   dividing light that passes the target optical system into a first wave front and a second wave front made by offsetting the first wave front by a predetermined amount in a predetermined direction;
   obtaining information concerning an interference fringe using shearing interference with divided light;
   calculating a differential wave front between the first wave front and the second wave front by using the information concerning the interference fringe obtained in said obtaining step; and
   correcting the differential wave front based on the predetermined amount and a wave number in the predetermined direction.

2. A measuring method according to claim 1, wherein said calculating step includes the step of calculating a two-dimensional wave number distribution function through a two-dimensional Fourier transformation to the differential wave front,
   wherein said correcting step includes the step of multiplying the two-dimensional wave number distribution function by a correction coefficient of $1/(2i \times \sin(\alpha \Delta x/2))$, where $\Delta x$ is the predetermined amount, $\alpha$ is the wave number in the predetermined direction, and $i$ is the imaginary unit, and
   wherein said measuring method calculates the wave front of the target optical system through a two-dimensional inverse Fourier transformation to the wave number distribution function multiplied by the correction coefficient.

3. A measuring method according to claim 1, further comprising the step of varying at least one of the predetermined amount and the predetermined direction.

4. An exposure method comprising the steps of:
   calculating a wave front aberration of a target optical system using a measuring method;
   adjusting the target optical system based on the wave front aberration of the target optical system, which is calculated in said calculating step; and
   exposing an object using the target optical system adjusted in said adjusting step,
   wherein said measuring method measures wave front of light, which has passed through the target optical system, said measuring method comprising the steps of:
   (i) dividing light that passes the target optical system into a first wave front and a second wave front made by offsetting the first wave front by a predetermined amount in a predetermined direction;
   (ii) obtaining information concerning an interference fringe using shearing interference with divided light;
   (iii) calculating a differential wave front between the first wave front and the second wave front by using the information concerning the interference fringe obtained in said obtaining step; and
   (iv) correcting the differential wave front based on the predetermined amount and a wave number in the predetermined direction.

5. A measuring apparatus for measuring a wave front of light, which has passed through a target optical system, said apparatus comprising:

a light divider for dividing the light that passes the target optical system into a first wave front and a second wave front made by offsetting the first wave front by a predetermined amount in a predetermined direction;

an obtaining part for obtaining information of an interference fringe using shearing interference with the light divided by the light divider;

an operation part for calculating a differential wave front between the first wave front and the second wave front by using the information concerning the interference fringe obtained by the obtaining step, for corrected the differential wave front based on the predetermined amount and a wave number in the predetermined direction, and for calculating the wave front of the target optical system based on the differential wave front that has been corrected.

6. A measuring apparatus according to claim 5, wherein the light divider includes plural exchangeable diffraction gratings each for dividing the light, the plural diffraction gratings having different grating constants.

7. A measuring apparatus according to claim 5, wherein the light divider includes plural exchangeable diffraction gratings each for dividing the light, the plural diffraction gratings having different pattern directions.

8. A measuring apparatus according to claim 5, wherein the light divider is rotatable around an optical axis of the target optical system.

9. A measuring apparatus according to claim 5, further comprising a unit that changes at least one of the predetermined amount and the predetermined direction.

10. An exposure apparatus for exposing a pattern on a mask onto an object using light, said exposure apparatus comprising:
   a projection optical system for projecting the pattern onto the object; and
   a measuring apparatus according to claim 5 for detecting a wave front aberration of the projection optical system.

11. An exposure apparatus according to claim 10, wherein the light has a wavelength of 20 nm or less.

12. A device manufacturing method comprising the steps of:
   exposing an object to be exposed using an exposure apparatus; and
   developing the object exposed,
   wherein said exposure apparatus includes:
   (i) a projection optical system for projecting the pattern onto the object; and
   (ii) a measuring apparatus according to claim 5 for detecting a wave front aberration of the projection optical system as an interference fringe using the light and shearing interference.

* * * * *

UNITED STATES PATENT AND TRADEMARK OFFICE
CERTIFICATE OF CORRECTION

| | |
|---|---|
| PATENT NO. | : 7,253,907 B2 |
| APPLICATION NO. | : 10/994331 |
| DATED | : August 7, 2007 |
| INVENTOR(S) | : Chidane Ouchi |

It is certified that error appears in the above-identified patent and that said Letters Patent is hereby corrected as shown below:

ON THE TITLE PAGE:
    In item "(57) ABSTRACT," line 4, "the" should read -- through the --.

COLUMN 2:
    Line 32, "passes a" should read -- passes through a --.
    Line 34, "passes the" should read -- passes through the --.

COLUMN 3:
    Line 1, "passes the" should read -- passes through the --.
    Line 6, "passes the" should read -- passes through the --.

COLUMN 4:
    Line 26, "βis" should read -- β is --.

COLUMN 5:
    Line 33, "referred /to" should read -- referred to --.

COLUMN 8:
    Line 7, "they" should read -- the y --.
    Line 59, "top" should read -- to --.

COLUMN 10:
    Line 8, "passes the" should read -- passes through the --.
    Line 52, "passes the" should read -- passes through the --.

UNITED STATES PATENT AND TRADEMARK OFFICE
CERTIFICATE OF CORRECTION

PATENT NO. : 7,253,907 B2
APPLICATION NO. : 10/994331
DATED : August 7, 2007
INVENTOR(S) : Chidane Ouchi It is certified that error appears in the above-identified patent and that said Letters Patent is hereby corrected as shown below:

<u>COLUMN 11:</u>
        Line 1, "passes the" should read -- passes through the --.
        Line 7, "divider;" should read -- divider; and --.
        Line 11, "corrected" should read -- correcting --.

Signed and Sealed this

Twenty-fourth Day of June, 2008

JON W. DUDAS
*Director of the United States Patent and Trademark Office*